United States Patent [19]
Schilling

[11] 4,125,308

[45] Nov. 14, 1978

[54] TRANSITIONAL RF CONNECTOR

[75] Inventor: William A. Schilling, Hightstown, N.J.

[73] Assignee: EMC Technology, Inc., Cherry Hill, N.J.

[21] Appl. No.: 800,861

[22] Filed: May 26, 1977

[51] Int. Cl.[2] .......................... H01R 17/04; H05K 1/04

[52] U.S. Cl. .............................. 339/17 LC; 333/84 M; 339/177 R

[58] Field of Search .......... 339/17 LC, 177 R, 177 E; 333/84 M, 97

[56] References Cited

U.S. PATENT DOCUMENTS

| | | | |
|---|---|---|---|
| 2,943,275 | 6/1960 | Bittner et al. | 333/84 M |
| 3,325,752 | 6/1967 | Barker | 333/97 |
| 3,340,495 | 9/1967 | Weinschel | 339/177 R |
| 3,426,311 | 2/1969 | Gifford | 339/177 R |

*Primary Examiner*—Neil Abrams
*Attorney, Agent, or Firm*—Hubbell, Cohen, Stiefel & Gross

[57] ABSTRACT

A stress-free transitional RF connector assembly is provided which electrically connects a planar conductor in a planar electric circuit with a cable or component having a conventional RF connector at one end thereof. The assembly includes a connector body one end of which is arranged to mate with the cable or component connector, and the other end of which is formed to accommodate the planar circuit. A conductive pin held in the connector body and extending to a fixed connection which may be made to the planar conductor is provided therebetween with a joint which permits rotation and axial movement relatively between the resulting two pin parts while maintaining electrical contact.

6 Claims, 9 Drawing Figures

TRANSITIONAL RF CONNECTOR

BACKGROUND OF THE INVENTION

1. Field of the Invention

This invention relates generally to RF connectors, and more particularly to RF transitional connectors of the type which electrically match and connect a planar electric circuit to a coaxial system.

2. Description of the Prior Art

Planar electrical circuits are well known in the art, particularly in the field of microwave technology. Such circuits include flat strip type conductors which may be etched onto a dielectric substrate or suspended in air. These conductors are also disposed close to an RF ground in such a way to provide a particular RF impedance for the circuit.

In order to couple planar circuits to other portions of an operating microwave system, it is often necessary to provide RF transitional connectors capable of connecting a coaxial cable or component to a particular planar conductor in the circuit, without significant loss due to interfacing two different modes of electrical propagation, i.e., coaxial and planar. It is desirable, therefore, that the characteristic impedance of both the coaxial system and the planar conductor be matched to one another, and further that the particular connector used carry this impedance between the coaxial and the planar conductor operating modes.

Prior art transitional connectors comprise a metallic coaxial connector body assembly, the system end of which is formed to mate with a coaxial connector. The other end of the transitional connector body usually takes the form of a rectangular flange which may be placed in abutment against a side of the planar circuit. A single conducting pin member extends coaxially through the transitional connector body and has one end thereof formed to electrically connect the pin member to the center pin in a coaxial connector. The other end of the pin member extends outwardly from the flange end of the transitional connector body, and may take the form of a narrow flat tab. This tab can be soldered or otherwise electrically connected to an edge of a planar conductor which runs near the side of the planar circuit structure.

It is apparent that the conventional transitional connector assembly may not operate entirely satisfactorily, due to the fact that one end of the single pin member extending therethrough is affixed to the edge of the planar conductor, while the other end of the pin member is subjected to both rotational and axial stresses when first engaging the coaxial connector center pin. These stresses cause the tabbed end of the pin member to break loose and interrupt electrical continuity with the planar conductor edge.

Various measures have been undertaken to prevent the transitional connector pin member from relative axial or rotational movement within the connector body. Such measures have included fluting a portion of the pin member which is seated within a dielectric supporting bead. The bead, in turn, can be staked to the connector body to thereby prevent rotation of the pin member. Axial movement of the pin member is restrained by providing a discontinuous cross section along a portion of the pin member, and allowing the supporting bead to engage this discontinuity to prevent relative axial movement.

SUMMARY OF THE INVENTION

The above and other shortcomings in the prior art transitional connectors are overcome by providing a metallic transitional connector body having a system end formed to engage a coaxial connector, and a circuit end dimensioned to accommodate a planar circuit structure. Extending through a circular opening in the connector body is a conducting pin member having its end closest to the circuit end of the connector body provided with an opening. This opening is dimensioned to receive one end of a novel transition pin which has its other end formed to electrically connect to a planar conductor in the planar circuit structure. The end of the pin member closest to the system end of the transitional connector body is formed to engage the coaxial connector center pin.

The inventive transitional connector assembly thereby provides a connector phase and a separate transition phase. By separating the two phases, it is possible to produce a coaxial transition connector that has excellent RF properties as a connector, and a transition pin that can be tailored to adapt to a particular planar circuit conductor as well as to provide excellent RF properties. Further, the pin member extending through the connector body may in fact rotate without deleteriously affecting a mounted transition pin, as long as a slip fit is maintained between the pin member and the transition pin. This eliminates the need for certain discontinuities along the pin member which were used to prevent pin rotation and which have impaired the RF performance of the prior transitional connectors. It will also be appreciated that the present invention achieves a stress-free electrical connection between a planar conductor and a coaxial system, wherein rotational and axial stresses usually transmitted to the conductor by the pin members in prior transitional connectors are substantially reduced.

Thus, the transitional RF connector assembly of the present invention provides a stress-free, well matched interface between a coaxial system and a planar electric circuit. Moreover, the new connector assembly will meet the interface and mating requirements of MIL-C-39012, insofar as that specification is applicable to transitional RF connectors.

DESCRIPTION OF THE INVENTION

Figure 1:
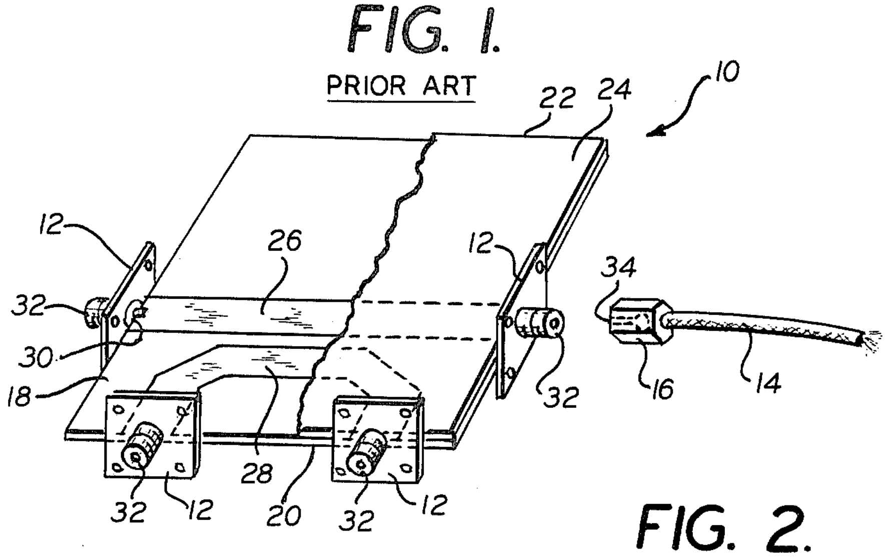
FIG. 1. PRIOR ART
FIG. 1 is a perspective view of a conventional planar electric circuit having conventional RF transitional connectors attached thereto.

Referring now to FIG. 1 in detail, there is shown a conventional microwave strip line coupler circuit 10, the circuit 10 being exemplary of one of the many forms of planar electric circuits well known in the art. The circuit 10 has four conventional transitional connectors 12 mounted to the structure thereof, the connectors being of the type for coupling the circuit to a coaxial cable or component. A cable 14, to be connected to the coupler circuit, is shown toward the right of the figure and has a mating cable connector 16 at one end thereof.

In further detail, the coupler circuit 10 may include two dielectric substrates, made, for example, of phenolic or epoxy resin, the lower substrate 18 having a conductive ground plane 20 extending across its bottom surface. Planar conductors 26, 28 are etched onto the upper surface of the substrate 18 and are oriented with respect to one another to provide the desired measure of coupling at the operating frequency. The upper substrate 22, shown fragmented only for purposes of illustration in FIG. 1, and having a conductive ground plane 24 extending across its top surface, overlies the coupler circuit conductors 26, 28 to complete the planar microwave coupler circuit structure.

Figure 2:
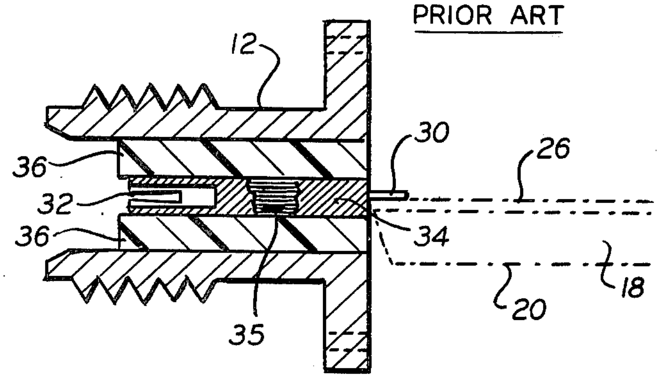
FIG. 2. PRIOR ART
FIG. 2 is a cross-sectional view of one of the prior art connectors shown in FIG. 1.

As indicated above, RF transition connectors must be provided in order to connect the planar conductors 26, 28 to a microwave system which may take many well known forms and is therefore not shown in the drawing. This connection is often by way of a coaxial cable such as shown by numeral 14. Conventional RF transitional connectors 12, further discussed below in regard to FIG. 2, have a unitarily formed conductive center pin 34, one end of which extends outwardly from a rear flange on the connector body to overlie the edge of one of the planar conductors 26, 28. This extended portion may be a flat tab 30 which can easily be soldered or otherwise bonded for RF contact to one of the conductors 26, 28. The other end of the pin may, as shown in FIGS. 1 and 2, have a small opening 32 extending a predetermined distance axially within the pin. The opening 32 is dimensioned to receive and make electrical contact with a center pin 34 centrally coaxially disposed within the cable connector 16 shown in FIG. 1.

It is to be understood that the planar circuit 10 is described for purposes of illustration only, and that other such circuits in the form of microstrip deposited on an alumina or a beryllia substrate, or air strip circuits, are widely known in the art. Further, transitional RF connectors corresponding to those shown by numeral 12 in FIGS. 1 and 2 are available to provide means for coupling coaxial systems to each of these other types of planar circuits.

The prior art connector 12 shown in FIG. 1 is illustrated in further detail in FIG. 2. It is seen that its center pin 34 is supported within the body of the connector 12 by way of a dielectric support bead 36. A dielectric most often used for the bead 36 is tetrafluroethylene. Of course, the relative dimensions of the pin 34, the dielectric support 36 and the outer body of the connector 12 are determined by the desired characteristic impedance for the connector, this value usually being 50 ohms. The pin 34 also has a fluted region 35 to inhibit rotation within the bead 36. While the tab 30 is shown to protrude from the end of the connector 12 which faces and mounts to the planar circuit structure, this protrusion may take on other forms as may be required to provide optimal RF coupling to a particular planar conductor in the circuit. Also, the pin 34 and the bead 36 may both extend a considerable distance out from the circuit end of the connector 12 before the pin 34 assumes a shape to conform with a planar electrode. Therefore, a wide variety of prior art transitional connectors must be available to allow matching between coaxial systems having various types of connectors, and different planar circuit structures each having numerous sizes and shapes of planar conductors to be connected to the system. This is so because the conventional transitional connector 12 includes both a metallic connector body arranged to mate with a particular coaxial connector, and a pin 34 having an end 30 formed to electrically connect to a specific planar conductor. This problem, and others, associated with the prior art transitional RF connectors is now overcome by the present invention.

Figure 3:
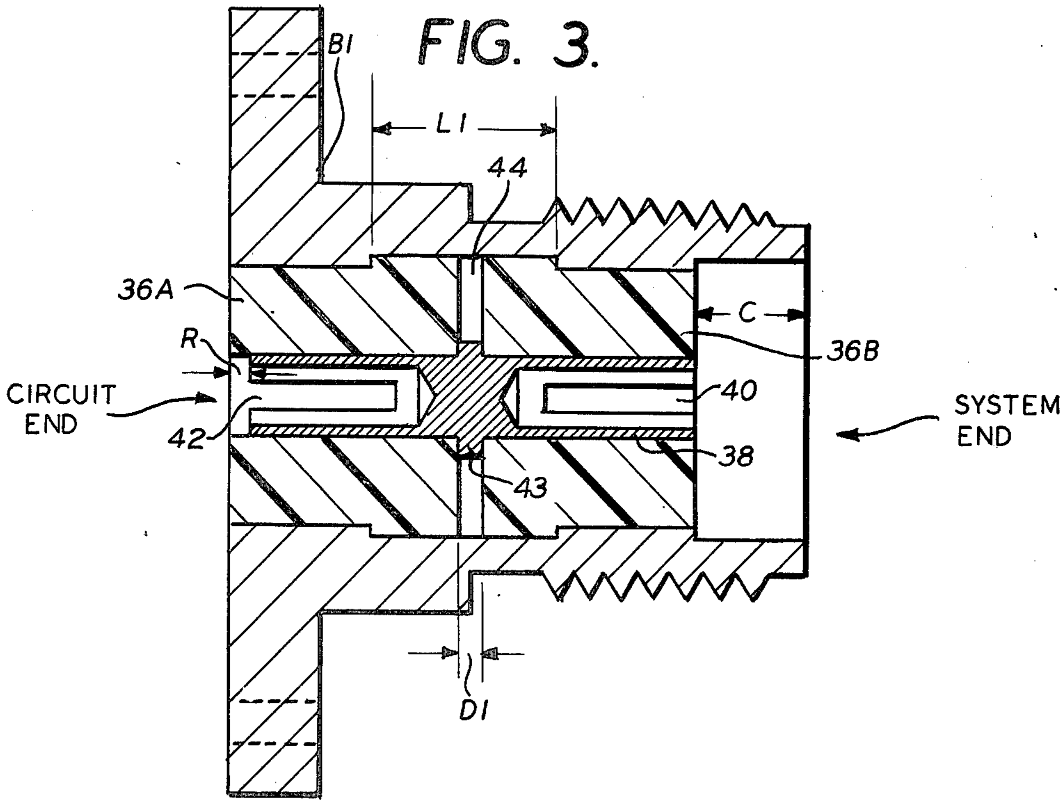
FIG. 3 shows, in section, an embodiment of the present inventive transitional RF connector.

An embodiment of the present invention having a jack type coaxial connector body assembly is shown in FIG. 3. The inventive connector assembly has a metallic coaxial body B1 with a rectangular flange formed at its circuit end, and a threaded coaxial jack formed at the system end thereof. A pair of dielectric support beads 36A, 36B which may be made of any suitable material such as polytetrafluoroethylene, support a unitary conducting pin 38. The pin 38 extends centrally axially within a circular bore provided between both ends of the jack body B1. The pin 38 also has a discontinuous cross section extending a distance D1 along its center portion within the jack body B1. The cross section extending for the length D1 defines a collar 43 about the pin, as shown in section in FIG. 3. Each of the support beads 36A, 36B is in abutment against respective sides of the shoulder 43 to define an air gap 44 between the collar 43 on the pin 38 and the jack body B1. The support beads 36A, 36B may themselves be formed to engage the inside circular wall of the jack body B1 which has a diametrically enlarged region extending a length L1. It will be understood that the pin 38, being supported by the beads 36A, 36B as shown in FIG. 3, is restrained from axial movement with respect to the jack body B1.

Still referring to FIG. 3, the pin 38 has respective openings 40, 42 at each of its ends. The pin 38 and support bead 36B both extend towards the system end of the connector body B1 to a predetermined depth C below the circular opening in the cable end of the body B1. This configuration is chosen for purposes of compatibility with SMA series RF plug type connectors such connectors being defined in MIL-C-39012. It is understood, therefore, that the actual configuration of the pin 38 and support bead 36B at the system end of the body B1 is determined by the particular coaxial connector series to be accommodated.

The supporting bead 36A is brought flush with the surface of the jack body B1 at its circuit end. The pin 38 extends towards the circuit end of the jack body B1 to a predetermined depth R below the surface of the circuit end of the body B1. The purpose and value of the predetermined depth R will be disclosed below in regard to FIGS. 6 and 7.

Figure 4:
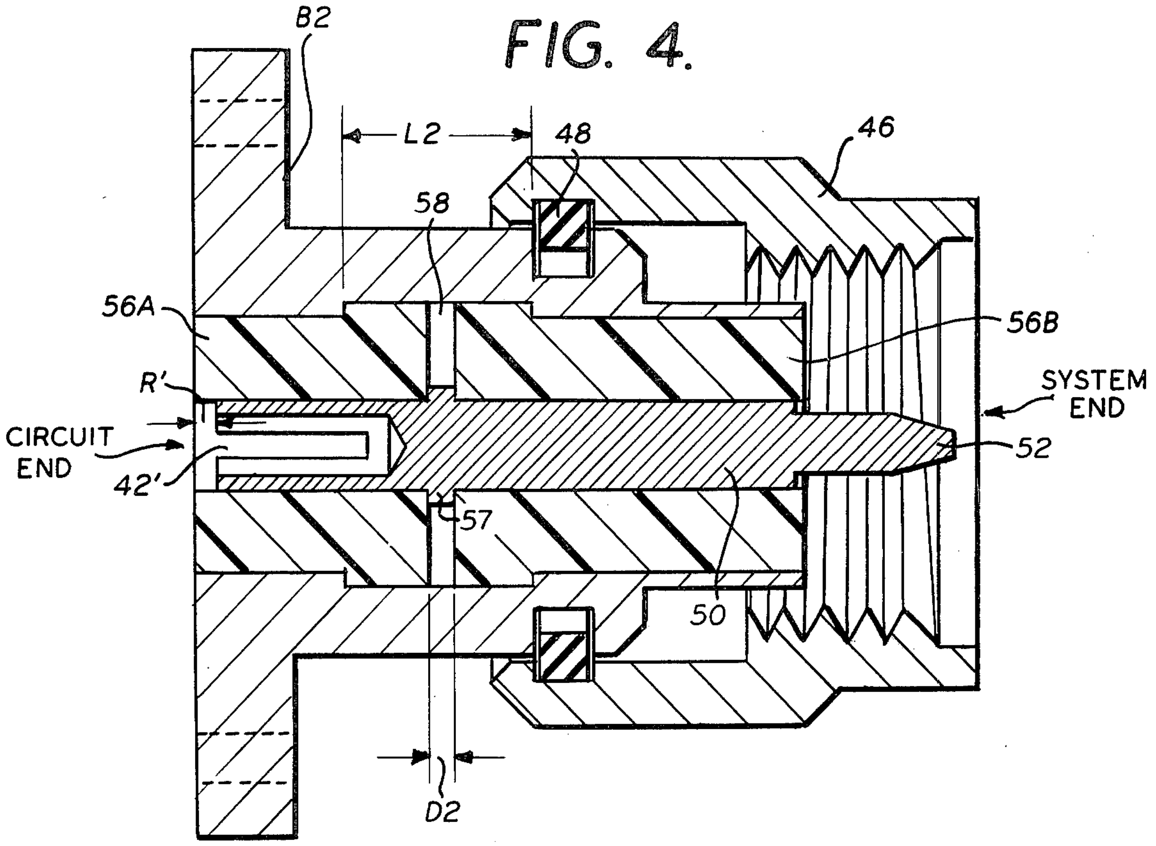
FIG. 4 is a cross-sectional view of another embodiment of the present transitional RF connector.

Another embodiment of the inventive RF transition connector assembly is shown in FIG. 4. This embodiment includes a plug type coaxial connector body B2 having a rotatable nut member 46 mounted at its system end. A nut retaining ring 48 engages a circumferential groove cut into the neck of the body B2. The system end of the transition connector assembly in FIG. 4 is configured for compatibility with SMA series jack type connectors, said connector series also being defined in MIL-C-39012. As is the case with the inventive connector in FIG. 3, the configuration at the system end of the connector in FIG. 4 is only for purposes of illustration and other configurations suitable for accommodating other series of connectors may be used.

In this embodiment, an electrically conductive pin 50 extends centrally axially within a circular bore provided between the ends of the coaxial plug body B2. The pin 50 is supported by a pair of dielectric beads 56A, 56B, such as, for example, polytetrafluoroethylene beads, and has a discontinuity in its cross section extending for a length D2 within the plug body B2. Further, the circular bore extending through the plug body B2 has an enlarged diameter region over a length L2 within the plug body B2. Each of the support beads 56A, 56B abut against respective surfaces of a collar 57 defined by the pin cross section over the length D2, and themselves engage the plug body B2 by way of an interference fit over the length L2 within the bore through the body B2. The inwardly facing ends of the beads 56A, 56B define an air gap 58 extending between the collar 57 on the pin 50 and the inner wall of the bore in the body B2. Relative dimensions for the pin 50, the beads 56A, 56B and the bore in the plug body B2 are determined by the desired characteristic impedance for the connector assembly.

The end of the pin 50 which faces towards the system end of the plug body B2 is tapered down as shown at 52 to engage a center pin in a mating jack connector (unshown). The end of the pin 50 closest to the circuit end of the plug body B2 has an opening 42′ similar to the opening 42 provided on the pin 38 in the inventive connector assembly shown in FIG. 3. The support bead 56A extends to the surface of the circuit end of plug body B2, while the pin 50 extends to a predetermined depth R′ below said surface. The purpose of the predetermined depth R′ will be explained later with reference to FIGS. 6 and 7.

The inventive transitional RF connector assemblies shown and described with respect to FIGS. 3 and 4 each have their system end configured to mate with particular series, e.g., SMA, connectors which are provided on coaxial cables or other components to be connected to the planar electric circuit. However, it will be observed that the circuit ends of the two inventive connector assemblies are entirely similar to one another insofar as the structural geometry of their pin members, support beads and connector bodies at that end. This partial similarity in the design of each of the connector assemblies characterizes an important feature of the present invention. Specifically, it is possible to use a variety of transition pins, each having an end formed to engage with the openings 42, 42′ provided on the conductive pin members 38, 50, respectively. In other words, a transition pin having one end formed for optimum RF compatibility with a particular planar conductor will operatively engage the circuit end of either of the inventive connector assemblies shown in FIGS. 3 and 4. This feature provides a degree of design flexibility not yet heretofore attained.

Figure 5A:
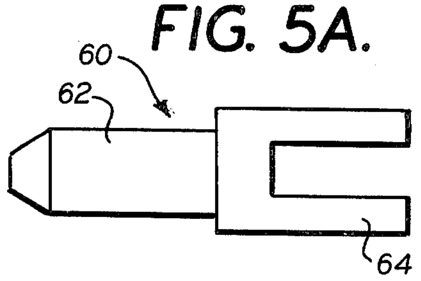
FIGS. 5A, 5B and 5C show, in profile, novel transition pins for connecting to the inventive connector assembly.
Figure 5B:
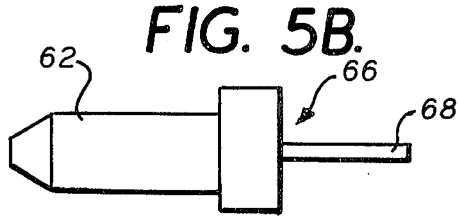
Figure 5C:
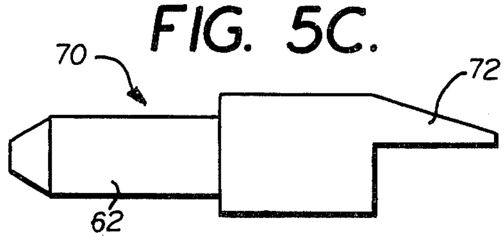

Some examples of transition pin members compatible with the inventive transitional connector assemblies are shown in FIGS. 5A–5C. Each of the transition pins illustrated is unitarily formed and has a cylindrical connector mating portion 62 dimensioned to slidably engage and electrically connect the transition pin to either of the inventive connector pin members 38, 50 by insertion of the portion 62 into the pin member openings 42, 42′, respectively. A suitable material for the transition pin is beryllium copper. The center body portions of the transition pins are also cylindrical and may extend over lengths greater than those suggested in FIGS. 5A–5C to connect to a planar conductor in a particular planar circuit. Moreover, standard cylindrical dielectric beads having complementary axial bores can be placed over the extended center body portions.

The transition pin 60 shown in FIG. 5A has an air strip planar conductor connecting portion 64 provided with a bifurcation to accommodate the air strip.

FIG. 5B shows another transition pin 66 having an end portion 68 in the form of a tab. The pin 66 is suitable for use with a strip line planar circuit such as the type shown in FIG. 1.

In certain applications, it may be desirable to use a transition pin as shown in FIG. 5C. The pin 70 also has a connector mating portion 62. However, the circuit connecting portion 72 has been tailored to optimally match a particular planar conductor (unshown) in the planar circuit structure to the inventive connector.

Figures 6, 7:
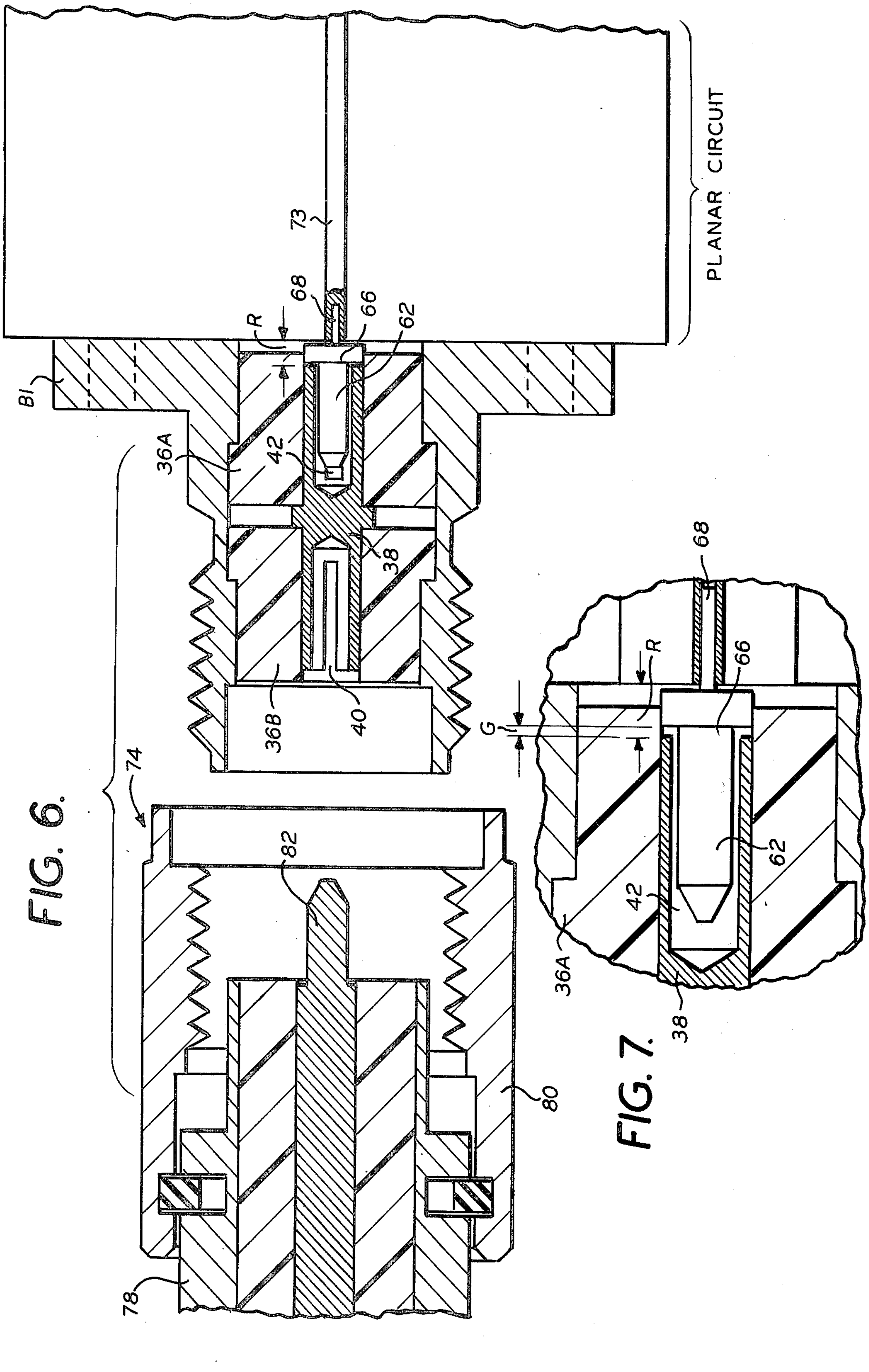
FIG. 6 is an exploded sectional view showing the connector assembly of FIG. 3 and the transition pin in FIG. 5B mounted to a planar circuit, and a cable having a coaxial connector arranged to mate with the inventive connector assembly.
FIG. 7 is a fragmentary sectional view showing the transition pin of FIG. 5B mounted to the planar conductor as in FIG. 6, the transition pin engaging the inventive connector assembly.

An operative configuration of the inventive connector of FIG. 3 and a planar electric circuit is illustrated in FIG. 6.

A coaxial cable connector 74 having a locking nut member 80 is also shown prior to engaging the transitional connector body B1. In FIG. 6, the transition pin 66 of FIG. 5B is shown for purposes of illustration with its tab portion 68 joined to a planar conductor 73 in the planar circuit. The mating portion 62 of the transition pin 66 is shown as fully engaging the opening 42 in the pin member 38. In such position, the transition pin 66 electrically connects the pin member 38 with the planar conductor 73, the opening 42 being shaped so as to achieve a tight sliding fit between the pin member 38 and the transition pin mating portion 62. In addition to allowing relative axial movement between the pin member 38 and the transition pin 66 without significant loss of electrical contact therebetween, the opening 42 and the mating portion 62 are each formed to tolerate relative rotational movement with respect to one another, also without such loss.

It is important, however, that the pin member 38 not extend over the mating portion 62 of the transition pin 66 so far as to abut against the shoulder formed by the center body portion of the pin 66. Thus, the pin member 38 extends only to a predetermined depth R below the surface of the circuit end of the connector body B1. The depth R should therefore be greater than the length that the center body portion of the transition pin 66 extends within the support bead 36A. A gap G, as shown in FIG. 7, will then be defined between the shoulder on the transition pin 66 and the end of the mating pin member 38. It has been discovered that a gap G of from 0.002 to 0.010 inches (0.051 to 0.254 millimeters) allows a sufficient margin of safety without significantly affecting the electrical performance of the inventive connector assembly.

Still referring to FIG. 6, it is apparent that when the nut member 80 of the cable connector 74 is threaded onto the body B1 of the inventive connector, the pin 82 which operates to electrically connect the center conductor within the cable 78 to the pin member 38 will transmit both axial and rotative stresses to the pin member 38. As noted above, the pin member 38 may rotate about the mating portion 62 of the transition pin 66 so that the rotative stresses transmitted to the pin member 38 will not be fully communicated to the transition pin member 66. This feature will therefore greatly reduce the possibility of the transition pin 66 breaking away from the planar conductor 73 where its tab portion 68 is adjoined thereto. Moreover, axial stresses tending to move the pin member 38 towards the transition pin 66 will not be fully communicated to the transition pin 66 since the pin member 38 is free to move the gap length G before it abuts the shoulder on the transition pin 66.

In summary, the connector described hereinabove will provide a user with a number of significant design advantages when compared to transitional RF connectors presently available. For example, the user can now tailor a transition phase or pin to his particular needs, or use one of a number of stock transition pins. This control by the user can be exercised right from the inception of a particular design. Any later change in the design requires only a changed of the transition pin or bead which may be associated therewith. Moreover, purchasing and stocking a few basic connector assemblies, and ordering or making transition pins and associated beads as needed will obviously cost far less than providing a special transitional connector for each application. Also of importance is the stress-free connection achieved by the present connector, thereby significantly increasing the overall electrical and mechanical integrity of any particular coaxial/planar system interface.

What is claimed as new and desired to be secured by Letters Patent is:

1. An improved RF connector assembly for separably connecting an electrical cable to a planar circuit having a planar conductor, of the type which includes:

(a) a first connector part which is fixedly attachable to said cable; and (b) a second connector part which includes a metallic body, a dielectric bead having a body end and a conductor end, and a conductive pin having first and second ends, said second connector part being detachably connectable to said first connector part, said metallic body including means for fixedly mounting said second connector part onto said planar circuit, said body end of said dielectric bead being fixedly held within said metallic body, said conductive pin being fixedly held at said first end within said dielectric bead and being of such a length between said ends that said second end abuts said planar conductor when said second connector part is fixedly mounted onto said planar circuit, said second end being formed for fixed connection to said planar conductor, and the length of said dielectric bead between said body and conductor ends being such that said conductor end is adjacent said planar conductor when said second connector part is so fixedly mounted; wherein the improvement comprises:

a detachably connectable and electrically conductive joint in said conductive pin between said first and second ends, said joint including a first side and a second side, said first side defining a cylindrical cavity, and said second side including a mating cylindrical portion, both sides being located within said dielectric bead, said second side being so dimensioned relative to said cylindrical cavity as to achieve a tight sliding and rotating fit therewith, whereby said second end of said conductive pin is movable relative to said first end both axially and rotatably to thereby substantially prevent mechanical stress from passing down said conductive pin from said dielectric bead fixedly held within said metallic body to said fixed connection to said planar conductor.

2. An improved RF connector assembly for separably connecting a coaxial transmission line to a planar circuit having a planar conductor, of the type which includes:

(a) a first coaxial connector having a central conductor, said connector being fixedly attachable to said transmission line; and (b) a second coaxial connector which includes a metallic body having first and second ends, a dielectric bead having a body end and a conductor end, and a conductive pin having system and circuit ends, said metallic body being detachably connectable at said first end to said first coaxial connector, said metallic body including at said second end means for fixedly mounting said second coaxial connector onto said planar circuit, said body end of said dielectric bead being fixedly held coaxially within said metallic body, a portion of said conductive pin being supported coaxially within and restrained from axial movement relative to said dielectric bead, said system end of said conductive pin being within said first end of said metallic body, said system end being detachably connectable to said central conductor of said first coaxial connector when said metallic body is detachably connected to said first coaxial connector, said circuit end of said conductive pin being formed for fixed connection to said planar conductor, the length of said conductive pin between said system and circuit ends being such that said circuit end abuts said planar conductor when said second coaxial connector is fixedly mounted onto said planar circuit, and the length of said dielectric bead between said body and conductor ends being such that said conductor end is adjacent said planar conductor when said second coaxial connector is so fixedly mounted; wherein the improvement comprises:

said conductive pin including a connector pin part which includes said portion supported within said dielectric bead, a transition pin part which includes said circuit end abutting said planar conductor, a portion of said transition pin part located within said dielectric bead, and means for detachably connecting said parts which maintains electrical conduction between said parts while allowing movement between said parts axially and rotatably, to thereby substantially prevent mechanical stress from passing down said conductive pin from said dielectric bead fixedly held within said metallic body to said fixed connection to said planar conductor.

3. The improved RF connector assembly of claim 2, wherein said means for detachably connecting said parts comprises said connector pin part having an axial cylindrical cavity, and said transition pin part including an axial mating cylindrical member, said transisiton pin part being so dimensioned relative to said cylindrical cavity as to achieve a tight sliding and rotating fit therewith.

4. The improved RF connector assembly of claim 3, wherein said axial cylindrical cavity is defined by a plurality of fingers.

5. The improved RF connector assembly of claim 3, wherein said transition pin part includes a tapered end to facilitate entry into said axial cylindrical cavity.

6. The improved RF connector assembly of claim 3, wherein said transition pin part and said connector pin part are so located as to define an axial gap therebetween.

* * * * *